United States Patent
Fiedler

[19]

[11] Patent Number: 5,892,374
[45] Date of Patent: Apr. 6, 1999

[54] LATCHING COMPARATOR WITH INPUT OFFSET ADJUSTMENT

[75] Inventor: Alan Fiedler, Minneapolis, Minn.

[73] Assignee: LSI Logic Corporation, Milpitas, Calif.

[21] Appl. No.: 882,861

[22] Filed: Jun. 26, 1997

[51] Int. Cl.$^6$ ........................................... H03K 5/22
[52] U.S. Cl. ................................. 327/65; 327/57
[58] Field of Search ................... 327/50, 52, 55, 327/56, 57, 58, 62, 63, 64, 65, 68, 70, 72, 89, 77–82, 90; 330/252, 253, 261, 269, 277

[56] References Cited

U.S. PATENT DOCUMENTS 5,196,737  3/1993  Olmstead ................................ 327/208
5,329,173  7/1994  Murakami et al. ....................... 327/63
5,506,524  4/1996  Lin ........................................... 327/57

*Primary Examiner*—Timothy P. Callahan
*Assistant Examiner*—My-Trang Nu Ton
*Attorney, Agent, or Firm*—Westman, Champlin & Kelley, P.A.

[57] ABSTRACT

A latching comparator includes first and second current integration nodes having first and second integration capacitances, respectively. A current source applies a first tail current to a current steering circuit which steers the tail current onto the first and second current integration nodes as a function of first and second data signals. An offset adjustment circuit is coupled to the first current integration node for adjusting the first integration capacitance relative to the second integration capacitance. A latch circuit is coupled to the first and second current integration nodes and has a data output.

21 Claims, 3 Drawing Sheets

5,892,374

LATCHING COMPARATOR WITH INPUT OFFSET ADJUSTMENT

BACKGROUND OF THE INVENTION

The present invention relates to a latching comparator and, in particular, to a latching comparator having an input offset adjustment.

Successive approximation and flash analog-to-digital (A/D) converters have historically used some type of latching comparator and frequently incorporate some method of nulling the comparator's input-referred offset voltage. Input-referred offset adjustment capability is particularly important for maintaining accuracy in flash A/D converters. A single latching comparator can be combined with an N-bit D/A converter and with additional logic to form an N-bit successive-approximation A/D converter, or can be arrayed $2^N$ times to form an N-bit flash A/D converter.

A typical method of nulling input-referred offset involves measuring and storing the offset voltage on a sampling capacitor and then inserting the capacitor in series with the signal path. This method requires specialized circuitry and a certain sequence of operations such that the measured voltage exactly cancels the offset voltage of the comparator. A difficulty with this method is that the sampling capacitor results in a higher comparator input capacitance due to parasitic coupling of the sampling capacitor to the integrated circuit substrate on which the comparator is fabricated. Also, the sampling capacitor and the specialized track/hold and offset cancellation circuitry consume a relatively large area on the integrated circuit.

SUMMARY OF THE INVENTION

The latching comparator of the present invention includes first and second current integration nodes having first and second integration capacitances, respectively. A current source applies a switched tail current to a current steering circuit which steers the tail current onto the first and second current integration nodes as a function of first and second data signals. An offset adjustment circuit is coupled to the first current integration node for adjusting the first integration capacitance relative to the second integration capacitance. A latch circuit is coupled to the first and second current integration nodes and has a data output.

In one embodiment, the current steering circuit includes a differential transistor pair, and the offset adjustment circuit includes a first, voltage-controlled field effect transistor (FET) capacitor. A second FET capacitor is coupled to the second current integration node. A voltage applied to the voltage-controlled FET capacitor is varied to adjust the first integration capacitance relative to the second integration capacitance until the input-referred offset voltage is nulled out.

DETAILED DESCRIPTION OF THE PREFERRED EMBODIMENTS

Figure 1:
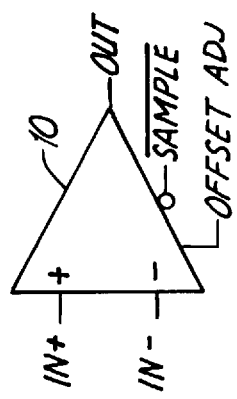
FIG. 1 is a diagram of a latching comparator according to the present invention.

FIG. 1 is a diagram of a latching comparator of the present invention. Latching comparator 10 includes inputs IN+ and IN−, output OUT, offset adjustment input OFFSETADJ and sample input $\overline{\text{SAMPLE}}$. On the falling edge of $\overline{\text{SAMPLE}}$, comparator 10 enters a regenerative state with positive feedback. The voltage difference between comparator inputs IN+ and IN− at the time $\overline{\text{SAMPLE}}$ goes low determines if the latch regenerates into a logic high state (OUT=1) or logic low state (OUT=0). The offset adjustment input OFFSET-ADJ is set to a voltage such that comparator 10 has a zero input-referred offset voltage.

Figure 2:
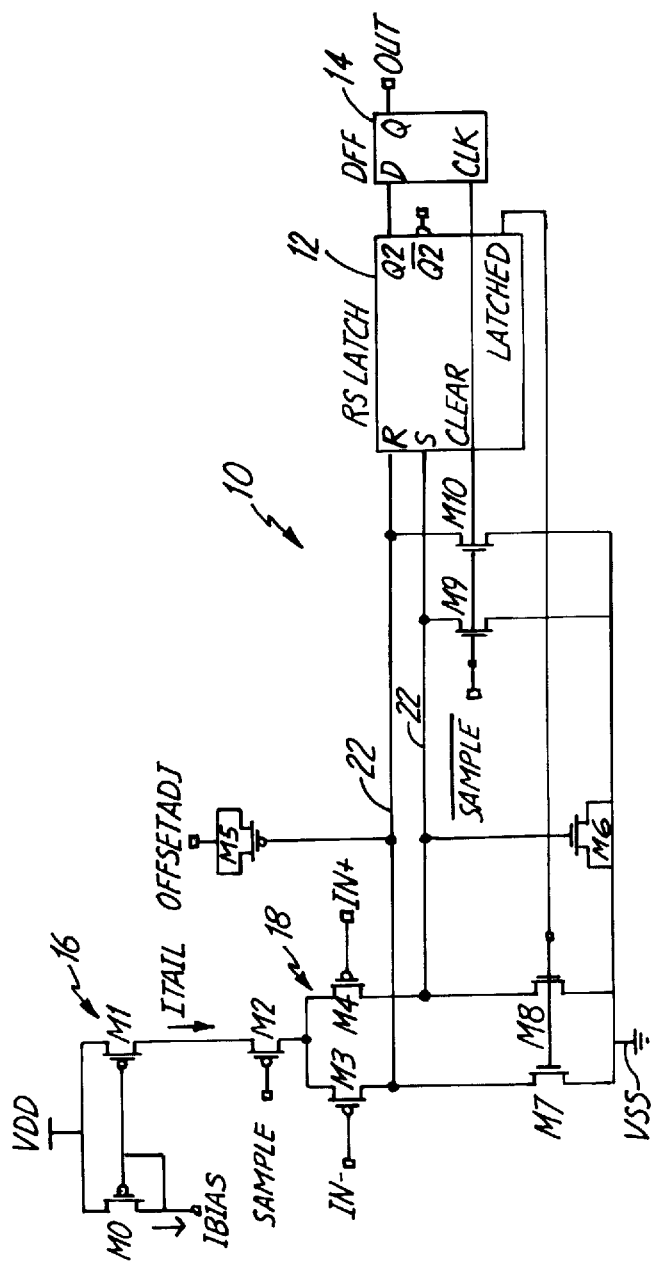
FIG. 2 is a more detailed schematic diagram of the latching comparator shown in FIG. 1.

FIG. 2 is a more detailed schematic diagram of latching comparator 10. Comparator 10 includes P-channel transistors M0-M5, N-channel transistors M6-M10, RS latch 12 and D-type flip-flop 14. Transistors M0 and M1 are coupled together to form current mirror 16 which sources a tail current ITAIL into the source of transistor M2 as a function of an input bias current IBIAS. The gate of transistor M0 is coupled to the drain of transistor M0 and to the gate of transistor M1. The source of transistor M0 is coupled to the source of transistor M1 and to supply terminal VDD. The drain of transistor M1 is coupled to the source of transistor M2. The input bias current IBIAS is generated by a suitable bias generator (not shown).

Transistor M2 has a gate coupled to sample input $\overline{\text{SAMPLE}}$, a source coupled to the drain of transistor M1 and a drain coupled to the sources of transistors M3 and M4. When $\overline{\text{SAMPLE}}$ goes low, transistor M2 turns on and applies tail current ITAIL to the sources of transistors M3 and M4.

Transistors M3 and M4 are coupled together to form differential pair 18. Transistor M3 has a gate coupled to comparator input IN− and a drain coupled to current integration node 20. Transistor M4 has a gate coupled to comparator input IN+ and a drain coupled to current integration node 22. Transistors M3 and M4 steer the tail current ITAIL onto current integration nodes 20 and 22 based on the relative voltages $V_{IN+}$ and $V_{IN-}$ on comparator inputs IN+ and IN−.

RS latch 12 includes reset input R, set input S, clear input CLEAR, complementary outputs Q2 and $\overline{Q2}$ and latched indicator output LATCHED. Reset input R is coupled to current integration node 20. Set input S is coupled to current integration node 22. Clear input CLEAR is coupled to sample input $\overline{\text{SAMPLE}}$. Output Q2 is coupled to data input D of D-type flip-flop 14. Latched indicator output LATCHED is coupled to the gates of transistors M7 and M8.

As the tail current ITAIL is steered through transistors M3 and M4 and integrated onto nodes 20 and 22, RS latch 12 regenerates to hold a zero (a logic low state) or a one (a logic high state) on output Q2, depending on whether reset input R or set input S reaches the logic threshold of RS latch 12 first. D-type flip-flop 14 has a data input D coupled to RS latch output Q2, an output Q coupled to comparator output OUT and a clock input CLK coupled to sample input $\overline{\text{SAMPLE}}$. D-type flip-flop 14 clocks the logic state on RS latch output Q2 to comparator output OUT on the rising edge of the sample input $\overline{\text{SAMPLE}}$.

Once RS latch 12 has regenerated and either latch output Q2 or $\overline{Q2}$ has switched from 0 to 1, latched indicator output LATCHED goes high, turning on transistors M7 and M8. Transistors M7 and M8 are coupled between current integration nodes 20 and 22, respectively, and supply terminal VSS. When latched indicator output LATCHED is active in the logic high state, transistors M7 and M8 pull the rising voltages on nodes 20 and 22 low toward supply terminal VSS, which terminates integration of the tail current on nodes 20 and 22. This helps reduce "kickback" of the voltages on nodes 20 and 22 onto comparator inputs IN+ and IN−.

Transistors M9 and M10 are coupled between nodes 22 and 20, respectively, and supply terminal VSS. The gates of transistors M9 and M10 are coupled to sample input $\overline{\text{SAMPLE}}$. When $\overline{\text{SAMPLE}}$ is in an inactive, logic high state, transistors M9 and M10 are on and pull the voltages on nodes 20 and 22 toward the voltage on supply terminal VSS. This maintains the voltages on nodes 20 and 22 in a balanced state until the next comparison when $\overline{\text{SAMPLE}}$ transitions to a logic low state.

Mismatches in transistor pairs M3–M4 and imbalances in the capacitive loading on reset input R and set input S result in an input-referred comparator offset voltage. With $V_{IN+}=V_{IN-}$, latching comparator 10 will typically favor latching to either a zero state or a one state. Transistor M5 allows for adjustment of the capacitance on integration node 20 relative to the capacitance on integration node 22 until latching comparator 10 will be equally likely to latch into a zero state or a one state. Transistor M5 is a voltage-controlled field effect transistor (FET) capacitor having a gate coupled to the current integration node 20 and a source and drain coupled to offset adjustment input OFFSETADJ. Transistor M6 is a depletion-mode FET capacitor and has a gate coupled to current integration node 22 and a source and drain coupled to supply terminal VSS. Adjusting the voltage $V_{OFFSETADJ}$ on offset adjustment input OFFSETADJ adjusts the capacitive loading and thus the integration time constant on node 20 relative to the capacitive loading and integration time constant on node 22. By adjusting one integration time constant relative to the other integration time constant until latching comparator 10 is equally likely to latch a zero state or a one state when $V_{IN+}=V_{IN-}$, the comparator's input offset voltage can be completely nulled out.

Figure 3:
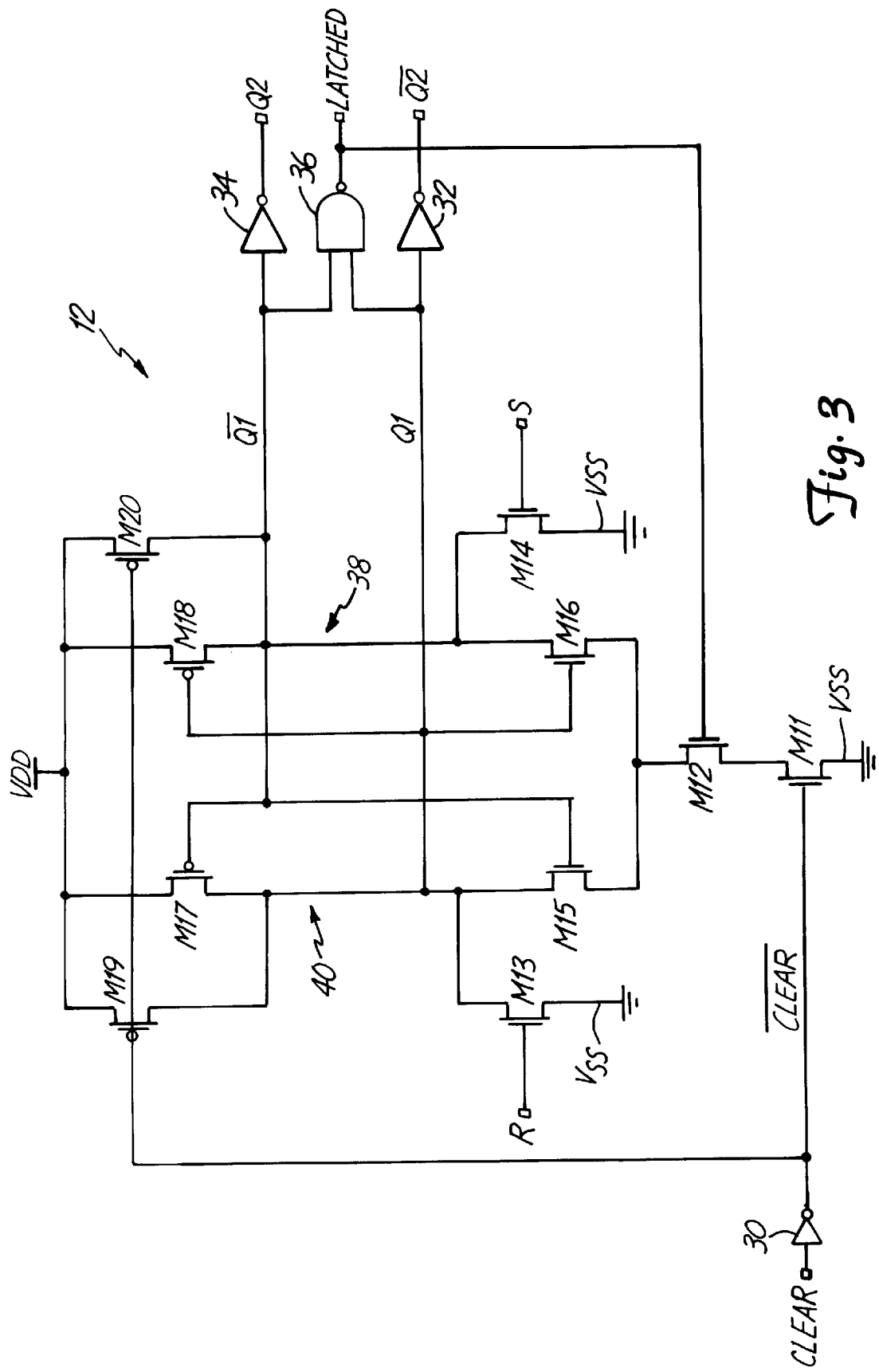
FIG. 3 is a schematic diagram of an RS latch used in the latching comparator shown in FIGS. 1 and 2.

FIG. 3 is a schematic diagram of RS latch 12. RS latch 12 includes N-channel transistors M11–M16, P-channel transistors M17–M20, inverters 30, 32 and 34 and NAND gate 36. Transistor M13 has a gate coupled to reset input R, a source coupled to supply terminal VSS and a drain coupled to internal latch node Q1. Similarly, transistor M14 has a gate coupled to set input S, a source coupled to supply terminal VSS and a drain coupled to internal latch node $\overline{Q1}$. Transistors M13 and M14 receive the rising voltages on reset input R and set input S. Depending upon which of the inputs R or S reaches the N-channel threshold voltage first, either transistor M13 or transistor M14 will turn on and pull the respective internal latch node Q1 or $\overline{Q1}$ low.

Transistors M15–M18 form a pair of cross-coupled inverters 38 and 40 between internal latch nodes Q1 and $\overline{Q1}$. Transistors M16 and M18 form inverter 38, which has an input coupled to node Q1 and an output coupled to node $\overline{Q1}$. Transistor M16 has a gate coupled to the gate of transistor M18, a source coupled to the drain of transistor M12 and a drain coupled to the drain of transistor M18. Transistor M18 has a source coupled to supply terminal VDD. Transistors M15 and M17 form inverter 40, which has an input coupled to node $\overline{Q1}$ and an output coupled to node Q1. Transistor M15 has a gate coupled to the gate of transistor M17, a source coupled to the drain of transistor M12 and a drain coupled to the drain of transistor M17. Transistor M17 has a source coupled to supply terminal VDD.

Nodes Q1 and $\overline{Q1}$ are coupled to latch outputs $\overline{Q2}$ and Q2, respectively, through inverters 32 and 34. NAND gate 36 is coupled between nodes Q1 and $\overline{Q1}$ and latched indicator output LATCHED.

CLEAR is coupled to the input of inverter 30. The output of inverter 30 is coupled to the gates of transistors M11, M19 and M20. Transistors M11 and M12 are pull-down transistors which are coupled in series between the sources of transistors M15 and M16 and supply terminal VSS. The gate of transistor M12 is coupled to the output of NAND gate 36. Transistors M19 and M20 are pull-up transistors which are coupled between supply terminal VDD and nodes Q1 and $\overline{Q1}$, respectively.

If reset input R reaches the threshold voltage $V_{TH,M13}$ of transistor M13 before set input S reaches the threshold voltage $V_{TH,M14}$ of transistor M14, then node Q1 will switch low before node $\overline{Q1}$. Upon node Q1 switching low, latched indicator output LATCHED will switch to an active high state. Transistor M12 turns on, pulling the sources of transistors M15 and M16 low toward supply terminal VSS through transistor M11, which reinforces the latched state by holding transistors M15 and M18 on and transistors M16 and M17 off.

At the rising edge of $\overline{\text{SAMPLE}}$, CLEAR goes high. The output of inverter 30 goes low, which turns off transistor M11 and turns on transistors M19 and M20. Transistor M11 decouples transistor M12 from supply terminal VSS which allows transistors M19 and M20 to pull nodes Q1 and $\overline{Q1}$ high toward the voltage on supply terminal VDD. This resets the latch by balancing nodes Q1 and $\overline{Q1}$ for the next comparison at the next falling edge of $\overline{\text{SAMPLE}}$. Transistor M11 may be removed in alternative embodiments if transistors M19 and M20 are large enough to pull nodes Q1 and $\overline{Q1}$ sufficiently high so as to force LATCHED low, shutting off transistor M12.

Figure 4:
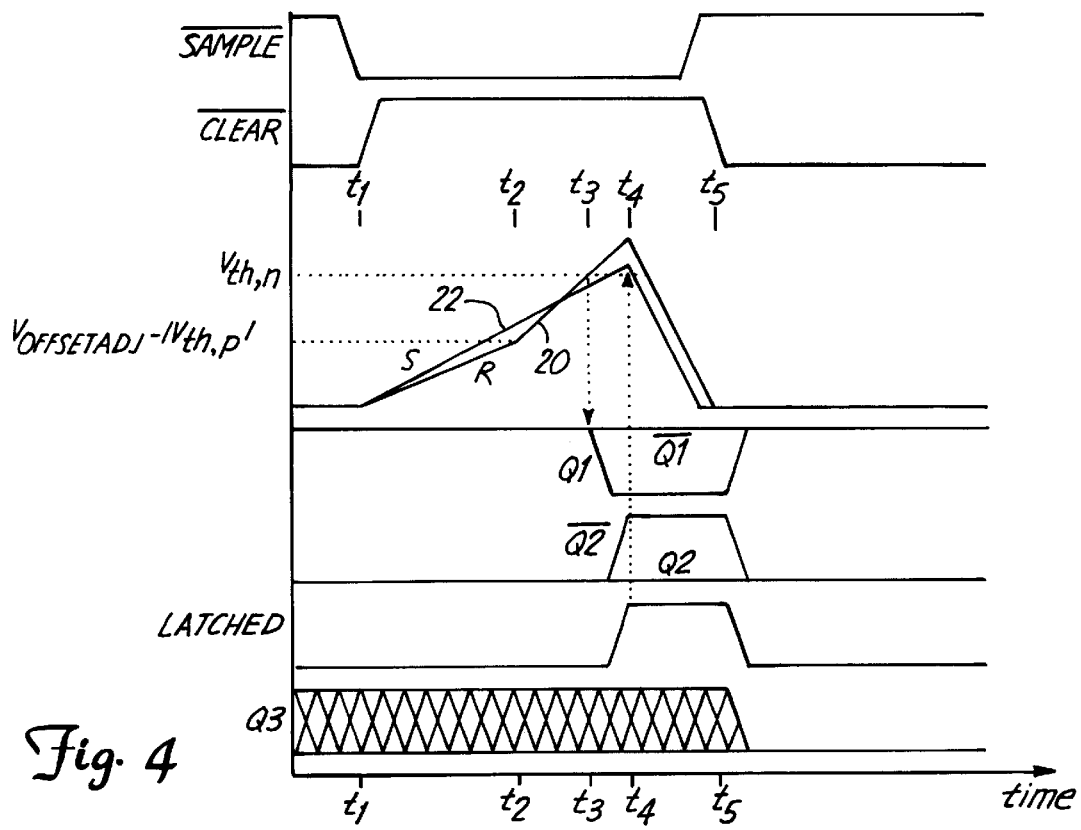
FIGS. 4 and 5 are waveform diagrams which illustrate various nodes of the latching comparator when an offset adjustment voltage applied to the latching comparator is set too high and too low, respectively.
Figure 5:
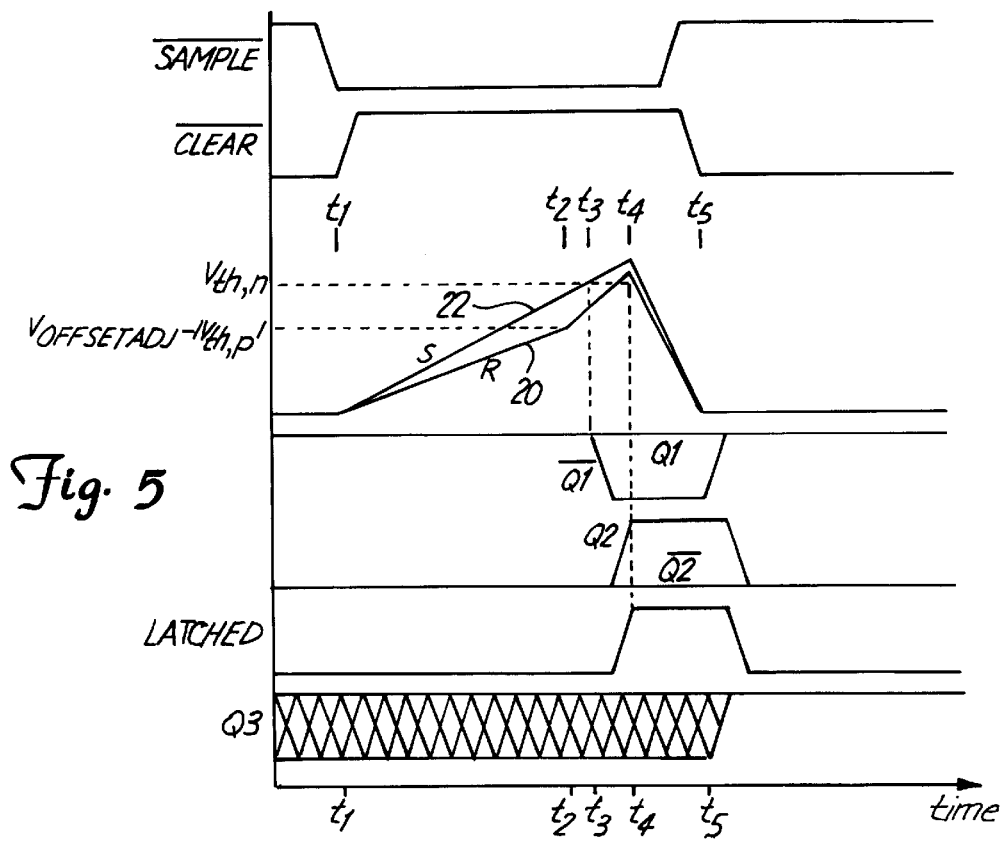

The sequential operation of latching comparator 10 and the effect of the offset adjustment are shown in more detail in FIGS. 4 and 5. FIG. 4 is a waveform diagram illustrating various nodes in latching comparator 10 when the voltage $V_{OFFSETADJ}$ applied to offset adjustment input OFFSETADJ is set too low. A too-low voltage $V_{OFFSETADJ}$ results in $Q2=Q3=0$ when $V_{IN+}=V_{IN-}$. A sample sequence begins at time $t_1$ with the falling edge of sample input $\overline{\text{SAMPLE}}$. Since $V_{IN+}=V_{IN-}$, approximately equal currents flow through transistors M3 and M4 (shown in FIG. 2). These currents are integrated onto nodes 20 and 22. Transistor M6 is a depletion-mode FET. With $V_{GS,M6}>0$, transistor M6 is in accumulation, and its gate capacitance is relatively constant and approximately equal to:

$$\left(\frac{\epsilon_0 A_{M6}}{t_{ox}}\right) \qquad \text{Eq. 1}$$

where $\epsilon_0$ is the dielectric constant of the gate oxide layer of transistor M6, $A_{M6}$ is the gate area of transistor M6 and $t_{OX}$ is the gate oxide thickness. From time $t_1$ to time $t_2$, the channel of transistor M5 is inverted, and its gate capacitance is relatively constant and approximately equal to:

$$\left(\frac{\epsilon_0 A_{M5}}{t_{ox}}\right) \qquad \text{Eq. 2}$$

where $A_{M5}$ is the gate area of transistor M5. In one embodiment, $A_{M5}=2A_{M6}$. Node 20 therefore rises slower than node 22 in the time interval from time $t_1$ to time $t_2$. At time $t_2$, transistor M5 turns off, its channel depletes, and its gate capacitance drops to zero. Node 20 then rises faster than node 22 after time $t_2$.

Depending on whether node 20 or 22 reaches the N-channel threshold voltage $V_{TH,N}$ first, RS latch 12 will latch a zero or a one on latch output Q2. In the example shown in FIG. 4, node 20 reaches the threshold first at time $t_3$, pulling internal latch node Q1 low. With node Q1 low, LATCHED goes high at time $t_4$. Transistors M7 and M8 turn on and arrest the rising voltages on nodes 20 and 22 by pulling the nodes low toward the voltage on supply terminal VSS.

On the rising edge of $\overline{\text{SAMPLE}}$, transistors M9 and M10 turn on, holding nodes 20 and 22 low in a balanced state. After $\overline{\text{SAMPLE}}$ transitions from low to high, $\overline{\text{CLEAR}}$ goes low at time $t_5$, which turns on transistors M19 and M20. Transistors M19 and M20 clear latch 12 by pulling internal latch nodes Q1 and $\overline{Q1}$ high. Also, LATCHED goes low, turning off transistor M12. This eliminates the influence of the current comparator and latch states on the outcome of the next sample phase.

Also on the rising edge of $\overline{\text{SAMPLE}}$, D-type flip-flop 14 clocks the logic low state on latch output Q2 to comparator output OUT and holds it until the next rising edge of $\overline{\text{SAMPLE}}$. Therefore, with $V_{IN+}=V_{IN-}$ and $V_{OFFSETADJ}$ set too low, latching comparator 10 favors latching a logic low state on comparator output OUT.

FIG. 5 is a timing diagram similar to FIG. 4, but with $V^{OFFSETADJ}$ set too high. With $V^{OFFSETADJ}$ set too high, node 22 at set input S reaches the N-channel threshold voltage $V_{THN}$ first at time $t_3$, turning on transistor M14. Transistor M14 pulls internal latch node $\overline{Q1}$ low, which results in a logic high state on latch output Q2 and comparator output OUT. LATCHED goes high at time $t_4$, turning on transistor M12. Transistor M12 reinforces the latched state by pulling and holding node $\overline{Q1}$ low through transistors M11 and M16. Therefore, with $V_{IN+}=V_{IN-}$ and $V_{OFFSETADJ}$ set too high, latching comparator 10 favors latching a logic high state on comparator output OUT.

By adjusting $V^{OFFSETADJ}$ when $V_{IN+}=V_{IN-}$ until latching comparator 10 is equally likely to latch a logic high state and a logic low state, the comparator's input offset voltage can be completely nulled out.

An advantage of the latching comparator of the present invention is that it allows for filtering of high frequency noise. By integrating the current flowing through transistors M3 and M4 onto nodes 20 and 22 from time $t_1$ to time $t_3$, a first-order low-pass filter function results. The total integration time and thus the filter cut-off frequency is controllable by adjusting the bias current IBIAS into transistor $M_0$. The bias current IBIAS must be large enough such that $t_3-t_1$ is less than the low duration of $\overline{\text{SAMPLE}}$, which is nominally half the sample period. This filter can thus be used to filter noise or undesirable signals at frequencies above two times the sampling frequency.

Another advantage of the latching comparator of the present invention is that it allows for a very low input capacitance, as compared to traditional auto-zeroed latching comparators. Elimination of the traditional track/hold circuitry at the latching comparator input results in an input capacitance that is equal to the gate capacitance of transistor M3 for the IN– input or the gate capacitance of transistor M4 for the IN+ input only There is no sampling capacitor which would otherwise result in a higher comparator input capacitance due to parasitic coupling of the sampling capacitor to the substrate. Also, elimination of the capacitors used for traditional track/hold and offset cancellation functions results in a latching comparator which consumes a very small area on the integrated circuit.

Although the present invention has been described with reference to preferred embodiments, workers skilled in the art will recognize that changes may be made in form and detail without departing from the spirit and scope of the invention. For example, although the present invention has been described with reference to a voltage-controlled FET capacitor, other devices that are suitable for adjusting the relative integration time constants of the current integration nodes can also be used with the present invention. Also, the entire circuit or portions of the circuit can be logically inverted. The present invention can be implemented with MOS technology or with various other technologies. The terms "pull-up" and "pull-down" used in the specification and in the claims are arbitrary terms and can refer to either a logic high level or a logic low level depending on the convention adopted and the relative states of the supply terminals. Likewise, individual signals can be active high or active low, and corresponding circuitry can be inverted to suit a particular convention. The term "coupled" can include various types of connections or couplings and can include a direct connection or a connection through one or more intermediate components.

What is claimed is:

1. A latching comparator comprising:

first and second comparator inputs for receiving first and second input data signals;

first and second current integration nodes having first and second integration capacitances, respectively;

a current source which supplies a first tail current;

a current steering circuit coupled to the current source and the first and second comparator inputs, which steers the first tail current onto the first and second current integration nodes as a function of the first and second input data signals;

offset adjustment means coupled to the first current integration node for adjusting the first integration capacitance relative to the second integration capacitance; and a latch circuit coupled to the first and second current integration nodes and providing a latched comparison output.

2. The latching comparator of claim 1 wherein the current steering circuit comprises a differential transistor pair.

3. The latching comparator of claim 1 and further comprising an offset adjustment input, and wherein the offset adjustment means is coupled between the offset adjustment input and the first current integration node.

4. The latching comparator of claim 1 wherein the offset adjustment means comprises a first, voltage-controlled field effect transistor (FET) capacitor.

5. The latching comparator of claim 4 wherein the offset adjustment means further comprises a second FET capacitor coupled to the second current integration node.

6. The latching comparator of claim 5 wherein the first, voltage-controlled FET capacitor has a gate area and the second FET capacitor has a gate area that is one-half the gate area of the first, voltage-controlled FET capacitor.

7. The latching comparator of claim 1 and further comprising:

a sample input for receiving a sample signal having an active state and inactive state; and a transistor coupled between the current source and the current steering circuit and having a control terminal coupled to the sample input.

8. The latching comparator of claim 1 and further comprising:

first and second supply terminals;

a sample input for receiving a sample signal having an active state and inactive state;

a first voltage balancing transistor coupled between the first current integration node and the second supply terminal and having a control terminal coupled to the sample input;

a second voltage balancing transistor coupled between the second current integration node and the second supply terminal and having a control terminal coupled to the sample input; and wherein the first and second voltage balancing transistors pull the first and second current integration nodes toward a common voltage when the sample signal is in the inactive state.

9. The latching comparator of claim 1 and further comprising a sample input for receiving a sample signal having an active state and inactive state, and wherein the latch circuit further comprises:

an RS latch comprising a reset (R) input coupled to the first current integration node, a set (S) input coupled to the second current integration node, a clear input coupled to the sample input, and a first latch output.

10. The latching comparator of claim 9 wherein the RS latch further comprises:

first and second supply terminals;

first and second internal latch nodes;

a first voltage sensing transistor coupled between the first internal latch node and the second supply terminal and having a control terminal coupled to the R input;

a second voltage sensing transistor coupled between the second internal latch node and the second supply terminal and having a control terminal coupled to the S input; and first and second cross-coupled inverters which are coupled between the first and second internal latch nodes.

11. The latching comparator of claim 10 wherein the RS latch further comprises:

a third inverter coupled to the clear input;

a first pull-up transistor coupled between the first internal latch node and the first supply terminal and having a control terminal coupled to the third inverter; and a second pull-up transistor coupled between the second internal latch node and the first supply terminal and having a control terminal coupled to the third inverter.

12. The latching comparator of claim 10 wherein the RS latch further comprises:

a NAND logic circuit coupled to the first and second internal latch nodes and generating a latched indicator signal on a latched indicator output, which has an active state and an inactive state; and a first pull-down transistor coupled between the cross-coupled inverters and the second supply terminal and having a control terminal coupled to the latched indicator output, wherein the first pull-down transistor provides a switched, second tail current to the cross-coupled inverters when the latched indicator signal is active.

13. The latching comparator of claim 12 and further comprising a third inverter coupled to the clear input, wherein the RS latch further comprises a second pull-down transistor coupled in series between the first pull-down transistor and the second supply terminal and having a control terminal coupled to the third inverter.

14. The latching comparator of claim 12 and further comprising:

a first current integration terminating transistor coupled between the first current integration node and the second supply terminal and having a control terminal coupled to the latched indicator output;

a second current integration terminating transistor coupled between the second current integration node and the second supply terminal and having a control terminal coupled to the latched indicator output; and wherein the first and second current integration terminating transistors pull the first and second current integration nodes toward a common voltage at the second supply terminal when the latched indicator signal is active.

15. The latching comparator of claim 10 wherein the RS latch further comprises a third inverter coupled between the first internal latch node and the first latch output.

16. The latching comparator of claim 15 wherein the RS latch further comprises a second latch output and a fourth inverter which is coupled between the second internal latch node and the second latch output.

17. The latching comparator of claim 9 and further comprising a D-type flip flop which is coupled between the first latch output and the comparison output and is clocked by the sample signal received on the sample input.

18. A latching comparator comprising:

first and second supply terminals;

first and second comparator inputs which receive first and second data input signals;

an offset adjustment input for receiving an offset correction signal;

first and second current integration nodes having first and second integration capacitances, respectively;

a current source coupled to the first supply terminal, which supplies a tail current;

a current steering circuit coupled to the current source and the first and second comparator inputs, which steers the tail current onto the first and second current integration nodes as a function of the first and second data signals and the first and second integration capacitances;

an integration capacitance adjustment device coupled between the offset adjustment input and the first current integration node, which adjusts the first integration capacitance relative to the second integration capacitance as a function of the offset correction signal; and a latch circuit coupled to the first and second current integration nodes and having an output.

19. The latching comparator of claim 18 wherein the current steering circuit comprises a differential transistor pair.

20. The latching comparator of claim 18 wherein the integration capacitance adjustment device comprises a first, voltage-controlled FET capacitor.

21. The latching comparator of claim 20 and further comprising a second FET capacitor coupled between the second current integration node and the second supply terminal.

* * * * *